United States Patent
Liebig

(10) Patent No.: US 12,417,535 B2
(45) Date of Patent: Sep. 16, 2025

(54) TRAINED FUNCTION FOR PROVIDING MAGNETIC FIELD DATA, AND THE APPLICATION OF THE TRAINED FUNCTION

(71) Applicant: Siemens Healthcare GmbH, Erlangen (DE)

(72) Inventor: Patrick Liebig, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 303 days.

(21) Appl. No.: 18/126,438

(22) Filed: Mar. 25, 2023

(65) Prior Publication Data

US 2023/0306599 A1 Sep. 28, 2023

(30) Foreign Application Priority Data

Mar. 25, 2022 (EP) .................................... 22164397

(51) Int. Cl.
 *G06T 7/00* (2017.01)
 *G01R 33/565* (2006.01)
 (Continued)

(52) U.S. Cl.
 CPC ...... *G06T 7/0014* (2013.01); *G01R 33/56563* (2013.01); *G06T 5/10* (2013.01); *G06T 5/70* (2024.01); *G06T 7/11* (2017.01); *G06T 11/008* (2013.01); *G06T 2207/10088* (2013.01); *G06T 2207/20056* (2013.01);
 (Continued)

(58) Field of Classification Search
 CPC .......... G06T 7/0014; G06T 7/11; G06T 5/10; G06T 5/70; G06T 11/008; G06T 2207/10088; G06T 2207/20056; G06T 2207/20081; G06T 2207/20084; G06T 2207/30016; G01R 33/56563; G01R 33/243; G01R 33/5608; G01R 33/5659;
 (Continued)

(56) References Cited

U.S. PATENT DOCUMENTS

2015/0145514 A1 5/2015 Sharma et al.
2020/0393951 A1 12/2020 Schweizer
 (Continued)

FOREIGN PATENT DOCUMENTS

CN 108132274 A 6/2018
CN 110610529 A 12/2019
 (Continued)

OTHER PUBLICATIONS

European search opinion for EP4249934 Sep. 6, 2022.*
 (Continued)

*Primary Examiner* — John B Strege
(74) *Attorney, Agent, or Firm* — Lempia Summerfield Katz LLC

(57) ABSTRACT

A method for providing magnetic field data includes receiving image data as input data of a trained function, and applying the trained function to the image data. The trained function is trained based on a data fidelity of image data corrected using the magnetic field data, and based on at least one assumption about at least one attribute of the magnetic field data. The method includes providing the magnetic field data as output data of the trained function.

20 Claims, 4 Drawing Sheets

(51) Int. Cl.
   *G06T 5/10* (2006.01)
   *G06T 5/70* (2024.01)
   *G06T 7/11* (2017.01)
   *G06T 11/00* (2006.01)

(52) U.S. Cl.
   CPC .............. *G06T 2207/20081* (2013.01); *G06T 2207/20084* (2013.01); *G06T 2207/30016* (2013.01)

(58) Field of Classification Search
   CPC .... G01R 33/246; G01R 33/38; G01R 33/385; A61B 5/055; G06V 10/761; G06V 10/774
   See application file for complete search history.

(56) References Cited

U.S. PATENT DOCUMENTS

| | | |
|---|---|---|
| 2021/0018583 A1 | 1/2021 | Gui et al. |
| 2021/0073993 A1 | 3/2021 | Regensburger et al. |
| 2021/0088605 A1 | 3/2021 | Shi |
| 2021/0259569 A1* | 8/2021 | Helle .................. G01R 33/36 |
| 2021/0270917 A1 | 9/2021 | Scheffler et al. |
| 2021/0341436 A1 | 11/2021 | Perdios et al. |
| 2021/0356547 A1 | 11/2021 | Nielsen et al. |

FOREIGN PATENT DOCUMENTS

| | | |
|---|---|---|
| CN | 112085153 A | 12/2020 |
| CN | 112470021 A | 3/2021 |
| CN | 112488289 A | 3/2021 |
| CN | 112771374 A | 5/2021 |
| CN | 112912749 A | 6/2021 |
| CN | 113406544 A | 9/2021 |
| CN | 114119791 A | 3/2022 |

OTHER PUBLICATIONS

Ashburner, John, and Karl J. Friston. "Unified segmentation." Neuroimage 26.3 (2005): 839-851.

Dai, Xianjin, et al. "Intensity non-uniformity correction in MR imaging using residual cycle generative adversarial network." Physics in Medicine & Biology 65.21 (2020): 215025, pp. 1-15.

Funai, Amanda K., et al. "Regularized field map estimation in Mri." IEEE transactions on medical imaging 27.10 (2008): 1484-1494.

Tustison, Nicholas J., et al. "N4ITK: improved N3 bias correction." IEEE transactions on medical imaging 29.6 (2010): pp. 1-23.

* cited by examiner

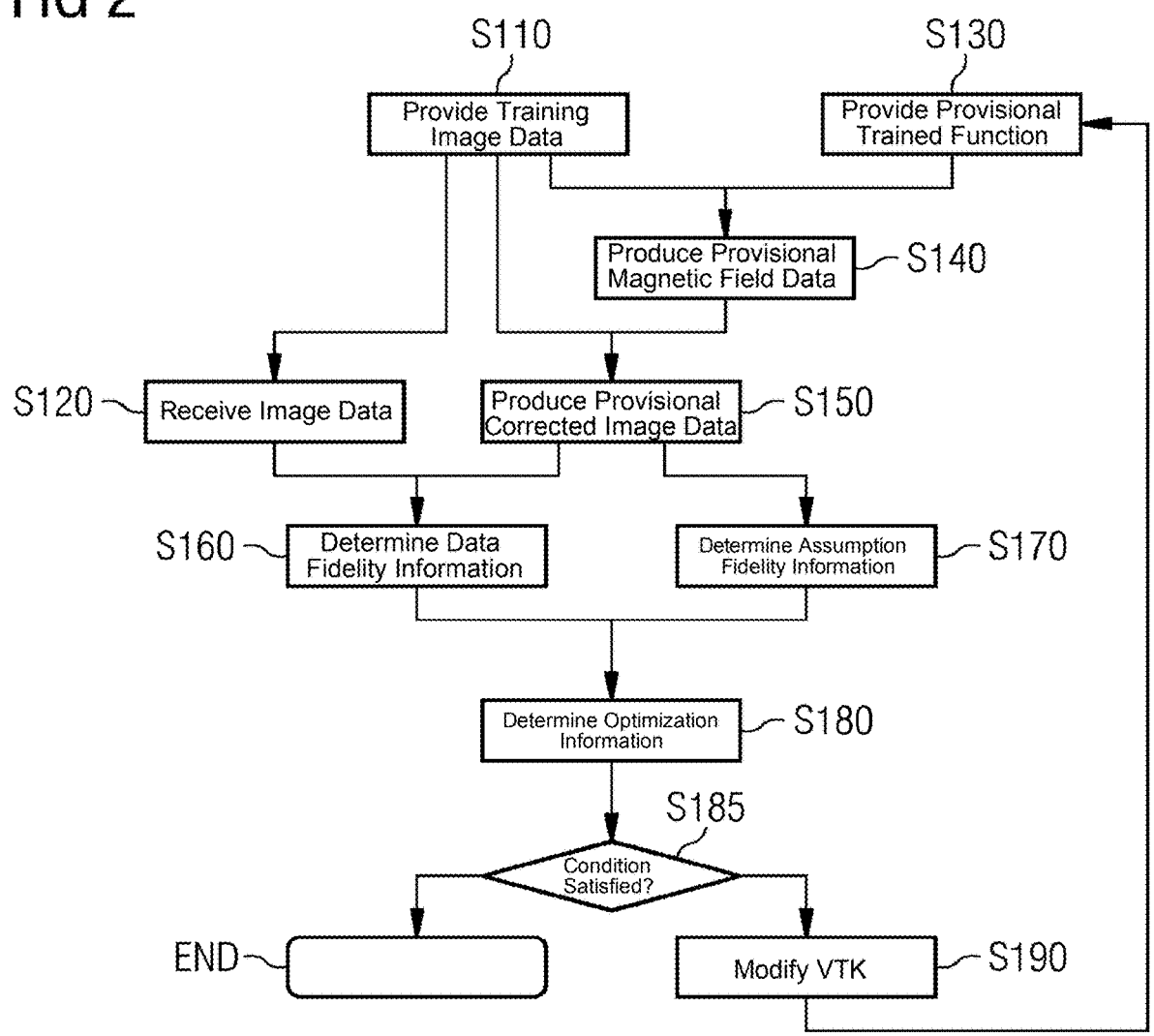

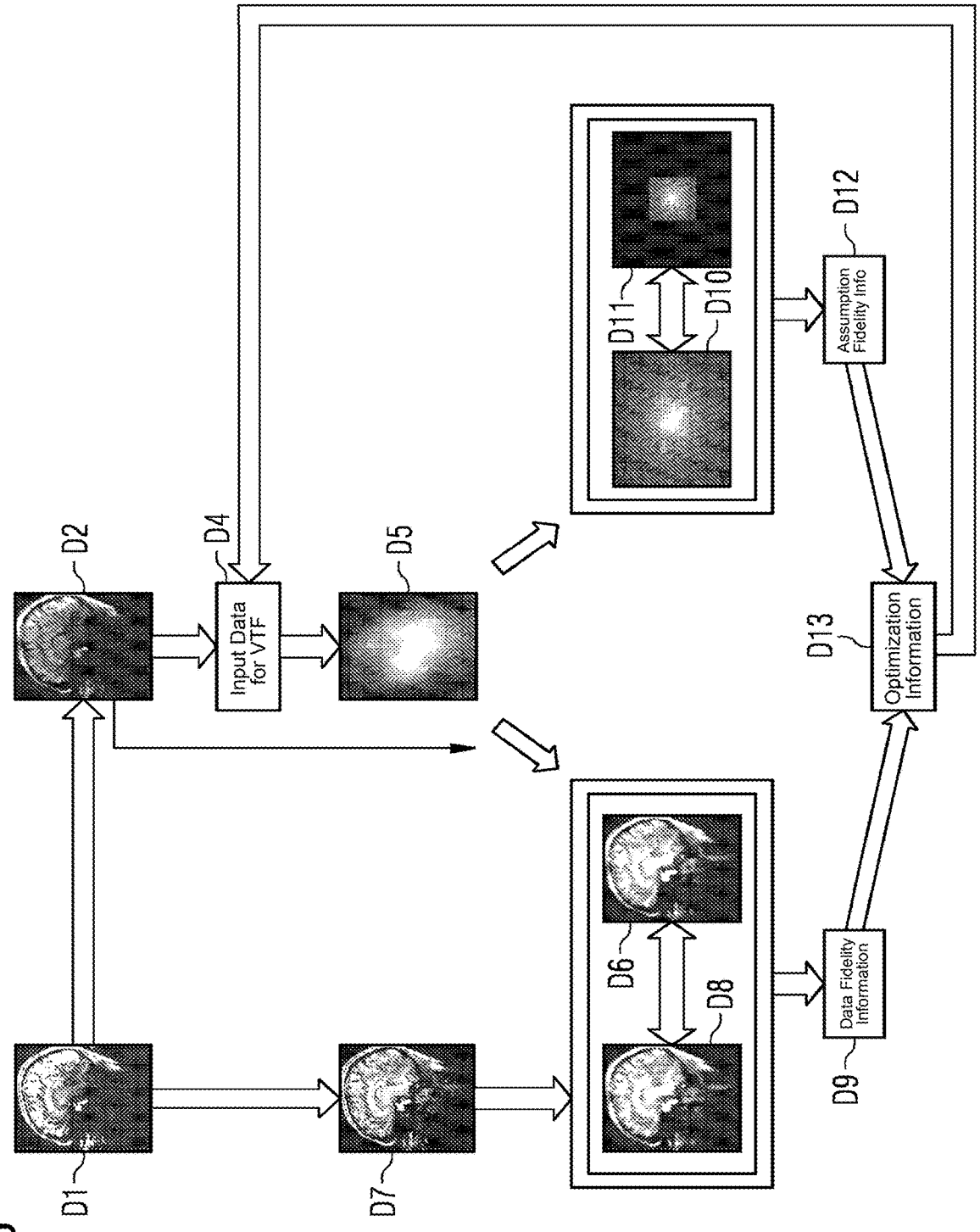

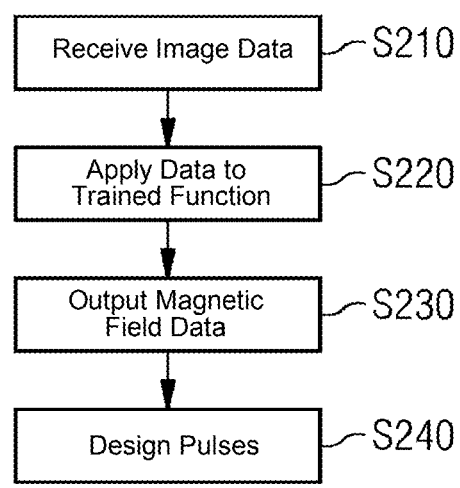

TRAINED FUNCTION FOR PROVIDING MAGNETIC FIELD DATA, AND THE APPLICATION OF THE TRAINED FUNCTION

This application claims the benefit of European Patent Application No. EP 22 164 397.6, filed on Mar. 25, 2022, which is hereby incorporated by reference in its entirety.

BACKGROUND

The present embodiments relate to a method for producing an optimized trained function for providing magnetic field data, to a method for providing magnetic field data by a trained function, to a system control unit, to a magnetic resonance apparatus, and to a computer program product.

In medical technology, high soft-tissue contrasts are a particular feature of imaging using magnetic resonance (MR), also known as magnetic resonance imaging (MRI), or magnetic resonance tomography (MRT). In this process, an object under examination (e.g., a patient) is positioned in an examination space of a magnetic resonance apparatus. During a magnetic resonance measurement, radiofrequency (RF) transmit pulses are radiated into the object under examination usually by a transmit coil arrangement of the magnetic resonance apparatus. In addition, gradient pulses are output by a gradient coil unit of the magnetic resonance apparatus to produce temporary magnetic field gradients in the examination space. The pulses that are produced excite and trigger spatially encoded magnetic resonance signals in the patient. The triggered magnetic resonance signals are received by a receive coil arrangement of the magnetic resonance apparatus and used to reconstruct magnetic resonance images.

An RF transmit pulse produces an alternating magnetic field, known as a $B1^+$ field, in an examination region, in which the patient is located during the magnetic resonance measurement. The $B1^+$ field therefore constitutes a distribution of the transmit field. A $B1^-$ field describes a distribution of a receive field. If the transmit coil arrangement and the receive coil arrangement are identical, it may often be assumed that the $B1^+$ field and $B1^-$ field are substantially the same. The effective transmit-receive field may also be referred to as the B1 field.

In addition, a strong static main magnetic field, the B0 field, is produced in the examination region. This may also be as homogeneous as possible in order to avoid artifacts in the magnetic resonance images. In reality, however, the main magnetic field may have inhomogeneities in some places. It is an advantage for, amongst other things, compensating for inhomogeneities in the main magnetic field (e.g., using shim coils), also to know the B0 field (e.g., the spatial distribution of the static main magnetic field).

SUMMARY AND DESCRIPTION

The scope of the present invention is defined solely by the appended claims and is not affected to any degree by the statements within this summary.

It is often time-consuming and/or inaccurate to use standard methods to determine magnetic field data, for example, describing the B1 field and/or the B0 field. The present embodiments may obviate one or more of the drawbacks or limitations in the related art. For example, a fast and/or robust method for providing magnetic field data may be provided. As another example, a device by which such a method may be performed is provided.

A computer-implemented method for producing an optimized trained function, OTF, for providing magnetic field data is provided. The method includes the acts: a) providing training image data, TBD; b) providing corrected training image data, KTBD, produced based on the TBD; c) providing a provisional trained function, VTF; d) producing provisional magnetic field data, VMD by applying the TBD to the VTF; e) producing provisional corrected image data, VKBD, based on the VMD and the TBD; f) determining data fidelity information based on the VKBD and the KTBD; g) determining at least one item of assumption fidelity information based on the VMD and an assumption about an attribute of the VMD; h) determining optimization information based on the data fidelity information and the at least one item of assumption fidelity information; and i) producing the OTF by optimizing the VTF based on the optimization information.

For example, the magnetic field data provided by the OTF may be used to reduce spatial amplitude variations and/or inhomogeneities in the magnetic resonance images. Such spatial amplitude variations and/or inhomogeneities in the magnetic field data may be reflected in the magnetic field data.

Acts a), b), and c) may be performed, for example, by provider units and/or interfaces suitable for each. Acts d), e), f), g), h), and i) may be performed, for example, by a computing unit suitable therefor. Such a computing unit may include, for example, one or more processors and/or memory modules.

Acts a) to i) (e.g., acts a) to c) and/or acts f) and g)) need not necessarily be performed in this order (e.g., alphabetical order).

A trained function (e.g., the VTF and the OTF) may map input data onto output data. The output data may depend, for example, also on one or more parameters of the trained function. For example, the trained function is a function trained using machine learning. Other terms for trained function may be, for example, trained mapping rule, mapping rule containing trained parameters, function containing trained parameters, algorithm based on artificial intelligence, or machine-learning algorithm. An example of a trained function is an artificial neural network, where edge weights of the artificial neural network are equivalent to the parameters of the trained function. The term "neural net" may also be used instead of the term "neural network." For example, a trained function may also be a deep artificial neural network (or a deep neural network). Another example of a trained function is a "support vector machine," and, for example, other machine-learning algorithms may also be used as the trained function.

The magnetic field data (e.g., the VMD) may be, for example, data that describes one or more attributes of a magnetic field. This may be, for example, a magnetic field in an examination region of a magnetic resonance apparatus. An object under examination to be examined may be arranged in the examination region during a magnetic resonance measurement by the magnetic resonance apparatus. The object under examination may be a patient, for example.

For example, the TBD may include measurement data that has been captured by a magnetic resonance apparatus (e.g., raw data, such as k-space data) and/or data derived (e.g., computed) from the measurement data (e.g., one or more magnetic resonance images reconstructed from raw data and/or k-space data). For example, this measurement data may have been captured in a magnetic resonance examination of an object under examination. For example, the TBD may include information about an anatomy of an object under examination.

The TBD may include, for example, a combined magnitude image. For example, a plurality of coil elements of a receive coil arrangement of the magnetic resonance apparatus may each receive magnetic resonance signals, from which a combined magnitude image may be created (e.g., the respective signals are combined). The TBD may include measurement data from different magnetic resonance measurements (e.g., from different objects under examination and/or parts, such as body parts, of the object under examination). For example, the VTF is trained successively with different raw data and/or magnetic resonance images.

For example, the KTBD may be corrected with respect to an attribute of a magnetic field (e.g., an inhomogeneity of a magnetic field). Numerous conventional (e.g., image-based) correction methods may be employed to correct the TBD and to provide, as a result thereof, the KTBD (e.g., correction methods such as Statistical Parametric Mapping (SPM), Non-parametric Non-uniform intensity Normalization (N3), N4ITK, Uniform Combined Reconstruction (UNICORN), and/or InhomoNet). As training the function (e.g., producing the OTF) is not subject to any particular time constraint, it is also not a problem if the correction methods are computationally intensive and time-intensive. The result of the training (e.g., the OTF) is configured, however, to provide magnetic field data in a short time (e.g., as part of a standard magnetic resonance measurement).

In one embodiment, the OTF may be produced or trained according to the method to cover a plurality of anatomies. Conventional methods are usually less suited to this. For example, the SPM algorithm typically only works well for the brain, and normally, different parameter sets for each anatomy are to be provided for the N4 algorithm.

The VTF may be based, for example, on a neural network having provisional, as yet unoptimized, edge weights as the parameters of the VTF. For example, the edge weights are initially set equal to 1, and, for example, a UNET is used as the architecture. For example, the produced OTF may be an optimized VTF. For example, provisional edge weights of the neural network may be modified as part of the optimization of the VTF in act i).

In one embodiment, the TBD is received as input data of the VTF, and applied to the VTF. In one embodiment, the VMD is output as the output data of the VTF.

Producing the VKBD includes, for example, correcting the TBD with respect to an attribute of a magnetic field (e.g., an inhomogeneity of a magnetic field based on the VMD).

Determining the data fidelity information includes, for example, applying a loss function and/or cost function to the VKBD and the KTBD. The data information may describe a similarity and/or data consistency and/or data fidelity between the VKBD and the KTBD. For example, the data fidelity information may be expressed as a data fidelity value. For example, the greater the similarity and/or data consistency and/or data fidelity between the VKBD and the KTBD, the smaller the magnitude of the data fidelity value. For example, if VKBD and KTBD were identical, the data fidelity value may equal zero. The data fidelity information may be used to provide (as far as possible) data fidelity and/or data consistency of image data corrected by the output data of the trained function (e.g., the magnetic field data) with image data corrected in other ways.

For example, one or more items of assumption fidelity information may be determined, each based on another assumption. Each of these assumptions may relate to different attributes of the VMD. The at least one item of assumption fidelity information may include at least one assumption fidelity value for each assumption. The OTF may be optimized by the method such that the magnetic field data output by the OTF satisfies the assumption (as far as possible). The at least one assumption may be at least one assumption to be satisfied (e.g., a condition).

The attribute of the VMD may be, for example, a manifestation, a peculiarity, and/or a characteristic, and/or structure of the VMD. This assumption may be, for example, a general and/or fundamental and/or non-specific assumption. For example, the assumption does not depend on the specific TBD that was provided as the input data of the VTF. The assumption may include, for example, an assumption about at least one general and/or fundamental and/or non-specific attribute of magnetic fields that typically arise in magnetic resonance apparatuses. The attribute may relate, for example, to a manifestation, and/or a peculiarity, and/or a characteristic, and/or structure of such magnetic fields. For example, the assumption may be based on prior knowledge of such magnetic fields.

In one embodiment, in order to optimize the VTF, acts c) to i) are performed iteratively (e.g., repeatedly). The OTF produced in act i) is provided as the VTF in act c) for a subsequent iteration (e.g., repetition). The method may include one or more of such iterations.

For example, the method includes iteratively minimizing at least one optimization value of the optimization information. Ideally, the optimization value then tends to become smaller and smaller from iteration to iteration.

An iteration may include evaluating the optimization information determined in act h) and/or the assumption fidelity information determined in act g) and/or the data fidelity information determined in act f) in order to optimize the VTF systematically in a subsequent iteration and produce the OTF. For example, the optimization information determined in act h) and/or the assumption fidelity information determined in act g) and/or the data fidelity information determined in act f) is compared with optimization information determined in act h) and/or assumption fidelity information determined in act g) and/or data fidelity information determined in act f) from a previous iteration, in order to optimize the VTF systematically in a subsequent iteration.

For example, if an optimization value, determined in act h), of the optimization information is larger in iteration N−1 than in iteration N, and if the aim is an optimization value that is as small as possible, then optimization of the VTF in iteration N+1 is performed with respect to the iteration N in the same direction as for the iteration N with respect to the iteration of N−1. If, for example, an optimization value, determined in act h), of the optimization information is smaller in iteration N−1 than in iteration N, and if the aim is an optimization value that is as small as possible, then optimization of the VTF in iteration N+1 may be performed with respect to the iteration N in the opposite direction from that for the iteration N with respect to the iteration of N−1.

Acts d) to i) may be performed iteratively (e.g., repeatedly) until the optimization information satisfies a defined condition. The defined condition may be understood in the sense of a termination condition.

For example, the optimization information includes an optimization value, and acts d) to i) are performed iteratively (e.g., repeatedly) until the optimization value is below a defined limit value. The limit value may be selected or defined such that, below this limit value, the VMD has a sufficiently good quality, or in other words, the VTF is optimized to such an extent that it is possible to output VMD of sufficiently good quality.

In one embodiment, the VMD describes a B1 field (e.g., a B1 map) and/or a B0 field (e.g., a B0 map) and/or a bias field (e.g., a bias map). For example, the VMD may be a B1 map and/or a B0 map and/or a bias map. The bias field may be, for example, a field that describes intensity perturbations and/or intensity variations caused by B1 inhomogeneities and/or B0 inhomogeneities.

A B1 map may be regarded, for example, as a representation of a two-dimensional or three-dimensional spatial distribution of a B1 field. A B0 map may be regarded, for example, as a representation of a two-dimensional or three-dimensional spatial distribution of a B0 field. A bias map may be regarded, for example, as a representation of a two-dimensional or three-dimensional spatial distribution of a bias field.

In one embodiment, the VMD describes a B1 map and/or bias map, and the underlying assumption in act g) relates to a smoothness of this B1 map or bias map. It may be assumed that the B1 map or the bias map is as smooth as possible (e.g., has, if possible, no edges, or edges that are as weak as possible) and/or has a low spatial resolution. For example, a measure of the spatial resolution may be ascertained empirically, and may be used as the (target) assumption. In one embodiment, by this assumption, the OTF is trained to suppress in the output data (e.g., in the magnetic field data, any anatomy information contained in the input data, such as the image data).

Determining the optimization information may include a relative weighting of the data fidelity information and the at least one item of assumption fidelity information. The weighting (e.g., any weighting factors specifying the weighting) may be ascertained empirically, for example.

For example, the optimization information may include an optimization value that is a weighted sum of the data fidelity value and the at least one assumption fidelity value, where the coefficients of the sum represent weighting factors (e.g., $OW=DTW+\Sigma_n c_n \cdot ATW_n$, where OW is the optimization value, DTW is the data fidelity value, $C_n$ are the weighting factors, and $ATW_n$ are the assumption fidelity values).

The iterative optimization of the VTF to produce the OTF may then be expressed as an optimization problem min (OW) (e.g., minimize the optimization value) that is solved by iteratively adapting the VTF (e.g., the weights or edge weights thereof).

The TBD and/or the KTBD may be compressed (e.g., downsampled) image data. The amount of data associated with the image data may thereby be reduced, which may reduce the computational effort to produce the OTF. The compression of the image data may include, for example, reducing a spatial resolution of the image data.

For example, original training image data, $TBD_i$, is captured. Compression is used to produce the TBD from this data. In addition, original corrected training image data, $KTBD_i$, may be produced from the $TBD_i$ and, for example, may be used to produce the KTBD by compression.

The VTF may be based on a neural network (e.g., a convolutional neural network (CNN), such as a U-net).

A U-net may include a network having a contraction path and an expansion path. In the contraction path, spatial information may be reduced, whereas feature information is increased, and in the expansion path, feature information and the spatial information are recombined. This may increase resolution of the output data.

In one embodiment, in order to optimize the VTF (e.g., to produce the OTF), weights (e.g., edge weights) of the neural network on which the VTF is based are modified.

Producing the VKBD may include multiplying a B1 map described by the VMD with a magnetic resonance image described by the TBD. This multiplication may correct any image artifacts in the magnetic resonance image that are caused by inhomogeneities in the B1 field (which are described by the B1 map).

Determining the data fidelity information may include applying a cost function (e.g., an L1 cost function) to the VKBD and the KTBD. For example, determining the data fidelity information includes computing a comparison value (e.g., an L1 loss) between the VKBD and the KTBD. For example, the DTW may be represented as follows (e.g., as a penalty term of the optimization method for producing the OTF):

$$DTW=\|VKBD-KTBD\|_1$$

Determining the at least one item of assumption fidelity information may include producing k-space data, kRD, from a B1 map and/or bias map described by the VMD, where producing the kRD includes transforming the B1 map and/or the bias map into k-space using a Fourier transform. Comparison k-space data, VkRD, is produced from the kRD. Determining the at least one item of assumption fidelity information includes applying a cost function (e.g., an L1 cost function) to the kRD and the comparison k-space data. For example, the ATW may be represented as follows (e.g., as a further penalty term of the optimization method for producing the OTF):

$$ATW=\|kRD-VkRD\|_1$$

The Fourier transform may transform the B1 map into the k-space. For example, the k-space may be a spatial frequency domain. For example, the k-space may be described by a two-dimensional data model.

For example, the Fourier transform may be a two-dimensional Fourier transform. The Fourier transform may be, for example, a fast Fourier transform (FFT).

Producing the VkRD may include setting values of the kRD to zero in at least one segment of the k-space. The at least one segment lies outside a defined (e.g., central) segment of the k-space.

VkRD produced in this manner may be suitable for determining, by applying the cost function (e.g., the L1 cost function), as an assumption fidelity value ATW, a measure of a smoothness of the B1 map or bias map. For example, the VTF may be trained thereby to suppress in the production of the VMD any distracting information relating to an anatomy of an object under examination. The object was measured in order to provide the TBD.

For example, the k-space includes 128×128 points, where the defined segment includes 32×32 points that lie in the center of the k-space, and the values of the k-space points that lie outside this central segment are set to zero.

In addition, a computer-implemented method for providing magnetic field data (e.g., a B1 map and/or a B0 map and/or bias map) using a trained function is provided. This method includes receiving image data as input data of the trained function. The method includes applying the trained function to the image data, where the trained function is trained based on: i) a data fidelity of image data corrected based on magnetic field data; and ii) at least one assumption about at least one attribute of the magnetic field data. The method includes providing the magnetic field data as output data of the trained function.

The trained function may provide the magnetic field data quickly and reliably. A typical computation time may equal only a few seconds for an entire (e.g., three-dimensional) 3D volume, whereas conventional algorithms typically need a number of minutes.

The trained function may be an optimized trained function, OTF, that was produced by an above-described method for producing the OTF. Any advantages of this method may be transferred to the method for applying the trained function.

The image data may be received, for example, by a receive unit and/or interface suitable for the purpose. Applying the OTF to the input data may be performed, for example, by a computing unit suitable for the purpose. Such a computing unit may include, for example, one or more processors and/or memory modules. For example, such a computing unit may be part of a system control unit of a magnetic resonance apparatus.

In one embodiment, the trained function needs as input data solely the image data, and therefore, it is possible to dispense with any additional magnetic resonance measurements (e.g., preliminary measurements and/or calibration measurements). In one embodiment, applying the OTF is decoupled from reconstruction of magnetic resonance images.

Control data for performing a magnetic resonance measurement may be determined from the magnetic field data that is provided. A magnetic resonance measurement may be performed by the determined control data.

For example, the control data may be suited to the output of pTx pulses by a magnetic resonance apparatus. For example, the control data includes for each transmit coil of a plurality of transmit coils of a transmit coil arrangement, a shape and/or amplitude and/or phase of a sub-pulse and/or a time delay between the sub-pulses and/or the number of sub-pulses. For example, an emittable RF transmit pulse is composed of a plurality of sub-pulses that differ from one another and may each be transmitted by a transmit coil of a multichannel transmit coil arrangement (e.g., the emittable RF transmit pulse is a pTx pulse). In addition, a pTX pulse may also include at least one gradient pulse. For example, the control data may describe this totality of the sub-pulses of the multichannel pulse and/or of the at least one gradient pulse.

Using a pTx pulse, the B1 field produced thereby may be controlled more precisely; the control may, for example, for applications having a reduced field of view, be shaped saturation bands or for reducing the specific absorption rate (SAR). For example, a pTX pulse may be used to even out magnetic field inhomogeneities (e.g., as part of "RF Shimming") that may be advantageous at higher field strengths of the main magnetic field of 7 tesla and above.

The at least one shape and/or amplitude and/or phase of the RF transmit pulse or of a sub-pulse may correspond to, for example, a shape and/or amplitude and/or phase of a voltage pulse applied to the transmit coil arrangement, and/or of a current pulse flowing through the transmit coil arrangement.

The at least one shape and/or amplitude and/or duration of the gradient pulse may correspond to, for example, a shape and/or amplitude and/or duration of a voltage pulse applied to the gradient coil unit, and/or of a current pulse flowing through the gradient coil unit.

For example, inhomogeneities in the B1 field may lead to spurious variations in signal and contrast. In one embodiment, these variations are corrected during the magnetic resonance measurement itself. In one embodiment, this is done by using suitable pTx pulses that are determined using the magnetic field data determined by the OTF.

In addition, a system control unit that is configured to perform an above-described method for providing magnetic field data is provided. In addition, a magnetic resonance apparatus having the system control unit is provided.

The advantages of the system control unit and of the magnetic resonance apparatus are essentially the same as the advantages detailed above of the proposed method for providing magnetic field data. Features, advantages, or alternative embodiments mentioned in this connection may also be applied to the other subject matter, and vice versa.

A computer program product is also provided, which includes a program and may be loaded directly into a memory of a (programmable) system control unit of a magnetic resonance apparatus, and has program means (e.g., libraries and auxiliary functions) in order to execute a proposed method when the computer program product is executed in the system control unit of the magnetic resonance apparatus. The computer program product may include software containing a source code, which still needs to be compiled and linked or just needs to be interpreted, or an executable software code that, for execution, only needs to be loaded into the system control unit.

The method may be performed in a fast, identically reproducible, and robust manner by the computer program product. The computer program product is configured such that the computer program product may perform the method acts using the system control unit. The system control unit has the necessary specification such as, for example, a suitable RAM, a suitable graphics card, or a suitable logic unit in order to be able to perform the respective method acts efficiently. The computer program product is stored, for example, on a computer-readable medium (e.g., a non-transitory computer-readable storage medium) or on a network or server, from where it may be loaded into the processor of a local system control unit. The processor may be connected directly to the magnetic resonance apparatus or may form part of the magnetic resonance apparatus.

In addition, control data of the computer program product may be stored on an electronically readable data storage medium. The control data in the electronically readable data storage medium may be configured such that it performs a proposed method when the data storage medium is used in a system control unit of a magnetic resonance apparatus. Examples of electronic readable data storage media are a DVD, a magnetic tape, or a USB stick, on which electronically readable control data (e.g., software) is stored. When this control data is read from the data storage medium and stored in a system control unit of the magnetic resonance apparatus, all the embodiments of the above-described methods may be performed. Hence, the present embodiments may also proceed from the computer-readable medium and/or from the electronically readable data storage medium.

BRIEF DESCRIPTION OF THE DRAWINGS

Further advantages, features, and details of the invention appear in the exemplary embodiments described below and follow from the drawings. Corresponding parts are denoted by the same reference signs in all the figures, in which:

FIG. 2 shows, in a schematic diagram, one embodiment of a method for producing an optimized trained function for providing magnetic field data;

FIG. 3 shows various possible aspects of a method for producing an optimized trained function;

FIG. 4 shows, in a schematic diagram, examples of methods for providing magnetic field data using a trained function.

DETAILED DESCRIPTION

Figure 1:
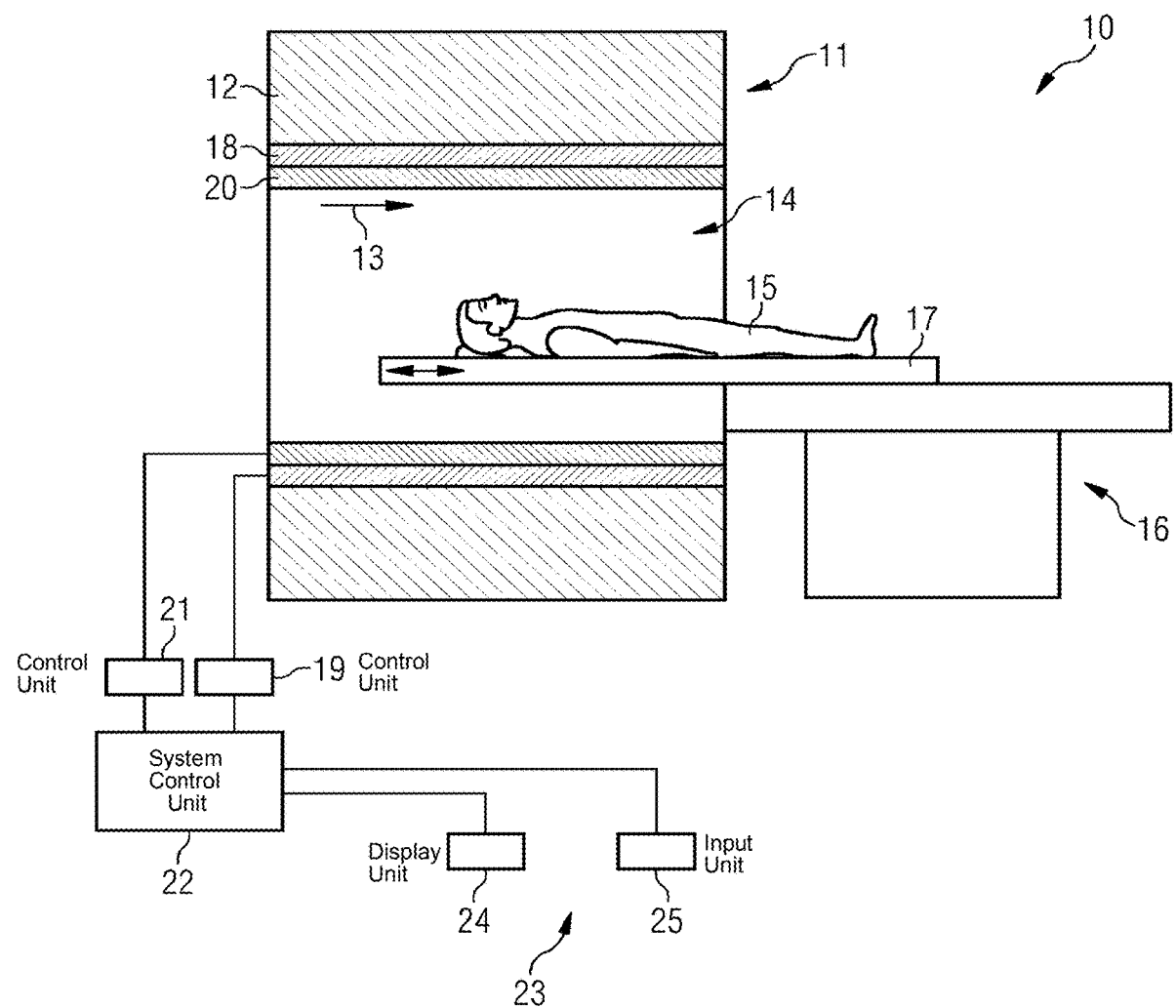
FIG. 1 shows in a schematic diagram of one embodiment of a magnetic resonance apparatus.

FIG. 1 shows schematically one embodiment of a magnetic resonance apparatus 10. The magnetic resonance apparatus 10 includes a magnet unit 11 that contains a main magnet 12 for generating a powerful main magnetic field 13 that, for example, is constant over time. The main magnetic field 13 may also be referred to as a B0 field. The magnetic resonance apparatus 10 also includes a patient placement region 14 for accommodating a patient 15. The examination region of the magnetic resonance apparatus 10 is located in the center of the patient placement region 14, in which the main magnetic field 13 has a particularly high homogeneity. In the present exemplary embodiment, the patient placement region 14 is shaped as a cylinder and is enclosed in a circumferential direction cylindrically by the magnet unit 11. In principle, however, the patient placement region 14 may have a different design. The patient 15 may be moved into the patient placement region 14 by a patient positioning apparatus 16 of the magnetic resonance apparatus 10. The patient positioning apparatus 16 includes, for this purpose, a patient couch 17 that is configured to be able to move inside the patient placement region 14.

The magnet unit 11 further includes a gradient coil unit 18 for generating magnetic field gradients that are used for spatial encoding during imaging. The gradient coil unit 18 is controlled by a gradient control unit 19 of the magnetic resonance apparatus 10. The magnet unit 11 also includes a radiofrequency antenna unit 20 that, in the present exemplary embodiment, is in the form of a body coil that is fixedly integrated in the magnetic resonance apparatus 10. The radiofrequency antenna unit 20 is controlled by a radiofrequency antenna control unit 21 of the magnetic resonance apparatus 10. The radiofrequency antenna unit 20 includes a transmit coil arrangement and a receive coil arrangement that, in this case, are the same (e.g., the coils used to emit RF transmit pulses are also the coils used to receive magnetic resonance signals). The transmit field may be referred to as the $B1^+$ field, and the receive field may be referred to as the $B1^-$ field. The RF transmit pulses are radiated into the examination region. Excitation of atomic nuclei thereby occurs in the main magnetic field 13 produced by the main magnet 12. Magnetic resonance signals are generated by relaxation of the excited atomic nuclei. The radiofrequency antenna unit 20 is configured to receive the magnetic resonance signals.

In magnetic resonance apparatuses that have a high-strength main magnetic field 13 (e.g., of 7 tesla), the transmit and receive coil arrangements may not be part of a body coil that is fixedly integrated in the magnetic resonance apparatus 10; instead, local transmit and receive coil arrangements (not depicted here) are arranged directly on the patient 15. Such transmit and receive coil arrangements, for example, include a plurality of transmit and/or receive channels, so that the transmit and receive coil arrangements are suitable for parallel transmitting and/or receiving.

The magnetic resonance apparatus 10 includes a system control unit 22 for controlling the main magnet 12, the gradient control unit 19, and the radiofrequency antenna control unit 21. The system control unit 22 centrally controls the magnetic resonance apparatus 10 (e.g., implementing a predetermined imaging gradient echo sequence). The system control unit 22 may be configured to perform a method for providing magnetic field data using a trained function, as shown in FIG. 4. In addition, the system control unit 22 includes an analysis unit (not presented in further detail) for analyzing the magnetic resonance signals acquired during the magnetic resonance examination. In addition, the magnetic resonance apparatus 10 includes a user interface 23 that is connected to the system control unit 22. Control data such as imaging parameters, for example, and reconstructed magnetic resonance images may be displayed to medical personnel on a display unit 24 (e.g., on at least one monitor) of the user interface 23. In addition, the user interface 23 includes an input unit 25 that may be used by the medical operating personnel to enter data and/or parameters during a measurement procedure.

FIG. 2 shows schematically one embodiment of a computer-implemented method for producing an optimized trained function, OTF, for providing magnetic field data. In S110, training image data, TBD, is provided. In S120, corrected training image data, KTBD, produced based on the TBD is provided. In S130, a provisional trained function, VTF, is provided. In S140, provisional magnetic field data, VMD, is produced by applying the TBD to the VTF. For example, the VMD may describe a B1 field (e.g., a B1 map) and/or a B0 field (e.g., a B0 map) and/or a bias field. In S150, provisional corrected image data, VKBD, is produced based on the VMD and the TBD. In S160, data fidelity information is determined based on the VKBD and the KTBD. In S170, at least one item of assumption fidelity information is determined based on the VKBD and an assumption about the VMD. In S180, optimization information is determined based on the data fidelity information and the at least one item of assumption fidelity information. In S185, it is checked whether the optimization information satisfies a defined condition. If the defined condition is satisfied, the method is terminated in END (e.g., the optimization of the VTF is then finished). The VTF is then the OTF. If the defined conditions is not (yet) satisfied, the optimization is continued by modifying the VTK in S190. The VTK modified in S190 is then the (new) VTK in S130. In a further iteration, the acts S130 to S180 are performed again, in order to check again, in S185, whether the defined condition is satisfied. Thus, if applicable, a plurality of iterations are performed in order to produce the OTF.

FIG. 3 aims to explain more precisely different aspects of a possible exemplary embodiment. Original training image data, $TBD_i$, D1 is provided. For example, this $TBD_i$ D1 may be acquired by a magnetic resonance measurement using the magnetic resonance apparatus 10, or derived (e.g., computed) from data acquired by the magnetic resonance apparatus 10.

Training image data, TBD, D2 is produced from the $TBD_i$ D1 by compression (e.g., by reducing the resolution). In one embodiment, the resolution is decreased (e.g., downsampled) to 128×128 pixels. The compression of the $TBD_i$ D1 may reduce a computational load needed subsequently (e.g., in S140, S150, S160, S170, and S180), because a smaller amount of data is to be processed; the compression is only optional, however.

The TBD D2 is provided in accordance with S110, and serves as input data for a VTF D4 that is provided in accordance with S130. For example, the VTF D4 is a deep-learning network based on U-net. Applying the VTF D4 to the TBD produces VMD in accordance with S140. The VMD is a map of, for example, a bias field D5 that describes inhomogeneities in the B1 field.

In accordance with S150, VKBD D6 is produced based on the VMD and the TBD D2. This is done by multiplying the map of a bias field D5 with the TBD D2, so that in the VKBD D6, the inhomogeneities in the B1 field may be compensated for. In accordance with S160, data fidelity information D9 is determined based on the VKBD D6 and the KTBD D8. In order to generate the KTBD D8, the $TBD_i$ D1 is first corrected with respect to the inhomogeneities in the B1 field (e.g., using a correction method such as Statistical Parametric Mapping (SPM), Non-parametric Non-uniform intensity Normalization (N3), N4ITK, and/or Uniform Combined Reconstruction (UNICORN)), so as to obtain original corrected training image data, $KTBD_i$, D7. The $KTBD_i$ D7 is then compressed (e.g., similar to the $TBD_i$, to a resolution of 128×128 pixels) in order to obtain the KTBD D8. In one embodiment, the compression is performed first, and the correction is then performed. Again, the compression of the $KTBD_i$ is only optional.

The data fidelity information D9 is determined by, for example, applying a cost function to the VKBD and the KTBD, with the costs (e.g., losses) determined in this process being the data fidelity information. An L1 cost function is suited, for example, for this purpose. The more the VKBD D6 matches the KTBD D8, the lower the value of the costs. Thus, the KTBD D8 acts as ground truth data for the VKBD D6.

In addition, in accordance with S170, at least one item of assumption fidelity information D12 is determined based on the VKBD and an assumption about the VMD. This is done by carrying out an FFT on the bias field D5 to obtain k-space data kRD, D10. The map of the bias field D5 is thus transformed from an image space into the k-space.

From the kRD, D10 is derived in turn comparison k-space data, VkRD, D11. This is done by, for example, setting to zero all the k-space values outside a central region of the k-space. In this case, the size of the central region is 32×32 k-space values. The assumption fidelity information D12 is the costs of a cost function applied to the kRD D10 and the VkRD D11. An L1 cost function is suited, for example. Thus, a high information content in the periphery of the k-space of the kRD D10 is penalized in this case.

The periphery of k-space typically contains information about edges in the associated image space (e.g., in this case, edges in the map of the bias field D5). It is assumed, however, that the bias field D5 may tend to have no edges; edges are typical of anatomical features of the object under examination, which are not meant to show up in the bias field D5. Therefore, the smoothness (e.g., the "lack of edges") is a suitable assumption for the bias map.

In this example, only one assumption about the bias map is made, or only one item of assumption fidelity information is determined. In one embodiment, however, more than one item of assumption fidelity information is determined.

In accordance with S180, optimization information D13 is determined based on the data fidelity information D9 and the assumption fidelity information D12. The optimization information D13 may be, for example, a weighted sum of the costs of the data fidelity information D9 and the costs of the assumption fidelity information D12. The associated weighting factors may be established empirically, for example.

The objective of the optimization may be, for example, to minimize the optimization information D13 (or an optimization value describing the optimization information D13). In accordance with S185, it may now be checked, for example, whether the optimization information D13 (or the optimization value describing the optimization information D13) is now already small enough. If this is the case, the optimization may be terminated, and therefore, the VKF used last is already the result of the optimization (e.g., is the OTF).

If the optimization information D13 (or the optimization value describing the optimization information D13) is not (yet) small enough, the VKF is modified, and one or more further iterations are performed using the modified VFK.

FIG. 4 shows schematically one embodiment of a computer-implemented method for providing magnetic field data. In S120, image data is received. In S220, the received image data is applied to a trained function that is trained based on a data fidelity of image data corrected using the magnetic field data, and based on at least one assumption about at least one attribute of the magnetic field data. The trained function may be an OTF according to a production method given in FIG. 2 and/or FIG. 3. In S230, the magnetic field data is output and provided. In S240, control data for performing a magnetic resonance measurement is determined from the magnetic field data provided.

In S240, a bias map (as output data of the OTF) is used to design pTx pulses, for example. These pTx pulses may be used, for example, for a T1-weighted, a T2-weighted, and/or a diffusion-weighted magnetic resonance measurement. For example, the magnetic field data output by the OTF may be used to perform RF shimming.

The methods described in detail above and the presented system control unit and magnetic resonance apparatus are merely exemplary embodiments that may be modified by a person skilled in the art in many different ways without departing from the scope of the invention. In addition, the use of the indefinite article "a" or "an" does not rule out the possibility of there also being more than one of the features concerned. Likewise, the term "unit" does not exclude the possibility that the components in question consist of a plurality of interacting sub-components that may also be spatially distributed if applicable.

While the present disclosure has been described in detail with reference to certain embodiments, the present disclosure is not limited to those embodiments. In view of the present disclosure, many modifications and variations would present themselves, to those skilled in the art without departing from the scope of the various embodiments of the present disclosure, as described herein. The scope of the present disclosure is, therefore, indicated by the following claims rather than by the foregoing description. All changes, modifications, and variations coming within the meaning and range of equivalency of the claims are to be considered within the scope.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A method that is computer-implemented and is for producing an optimized trained function, for providing magnetic field data, the method comprising:
   providing training image data;
   providing corrected training image data produced based on the training image data;

providing a provisional trained function;
producing provisional magnetic field data, the producing of the provisional magnetic field data comprising applying the training image data to the provisional trained function;
producing provisional corrected image data based on the provisional magnetic field data and the training image data;
determining data fidelity information based on the provisional corrected image data and the corrected training image data;
determining at least one item of assumption fidelity information based on the provisional magnetic field data and an assumption about an attribute of the provisional magnetic field data;
determining optimization information based on the data fidelity information and the at least one item of assumption fidelity information; and
producing the optimized trained function, the producing of the optimized trained function comprising optimizing the provisional trained function based on the optimization information.

2. The method of claim 1, wherein the providing of the provisional trained function, the producing of the provisional magnetic field data, the producing of the provisional corrected image data, the determining of the data fidelity information, the determining of the at least one item of assumption fidelity information, the determining of the optimization information, and the producing of the optimized trained function are performed iteratively, and
wherein the produced optimized trained function is provided as the provisional trained function for a subsequent iteration.

3. The method of claim 2, wherein the producing of the provisional magnetic field data, the producing of the provisional corrected image data, the determining of the data fidelity information, the determining of the at least one item of assumption fidelity information, the determining of the optimization information, and the producing of the optimized trained function are performed iteratively until the optimization information satisfies a defined condition.

4. The method of claim 1, wherein the provisional magnetic field data describes a B1 field, a B0 field, a bias field, or any combination thereof.

5. The method of claim 4, wherein the provisional magnetic field data describes a B1 map, a B0 map, the bias field, or any combination thereof.

6. The method of claim 1, wherein an underlying assumption in the determining of the at least one item of assumption fidelity information relates to a smoothness of a B1 map, a bias map, or the B1 map and the bias map described by the provisional magnetic field data.

7. The method of claim 1, wherein determining the optimization information comprises a relative weighting of the data fidelity information and the at least one item of assumption fidelity information.

8. The method of claim 1, wherein the training image data, the corrected training image data, or the training image data and the corrected training image data are compressed image data.

9. The method of claim 1, wherein the provisional trained function is based on a neural network, and
wherein optimizing the provisional trained function comprises modifying weights of the neural network on which the provisional trained function is based.

10. The method of claim 9, wherein the neural network is a convolutional neural network.

11. The method of claim 10, wherein the convolutional neural network is a U-net.

12. The method of claim 1, wherein producing the provisional corrected image data comprises multiplying a B1 map described by the provisional magnetic field data with a magnetic resonance image described by the training image data.

13. The method of claim 1, wherein determining the data fidelity information comprises applying a cost function to the provisional corrected image data and the corrected training image data.

14. The method of claim 13, wherein the cost function is an L1 cost function.

15. The method of claim 1, wherein determining the at least one item of assumption fidelity information comprises producing k-space data from a B1 map, a bias map, or the B1 map and the bias map described by the provisional magnetic field data,
wherein producing the k-space data comprises transforming the B1 map, the bias map, or the B1 map and the bias map into k-space using a Fourier transform,
wherein the method further comprises producing comparison k-space data from the k-space data,
wherein determining the at least one item of assumption fidelity information comprises applying a cost function to the k-space data and the comparison k-space data.

16. The method of claim 15, wherein the cost function is an L1 cost function.

17. The method of claim 15, wherein producing the comparison k-space data comprises setting values to zero in at least one segment of the k-space data, the at least one segment laying outside a defined segment of the k-space data.

18. A computer-implemented method for providing magnetic field data using a trained function, the computer-implemented method comprising:
receiving image data as input data of the trained function;
applying the trained function to the image data, wherein the trained function is trained based on:
a data fidelity of image data corrected based on magnetic field data; and
at least one assumption about at least one attribute of the magnetic field data; and
providing the magnetic field data as output data of the optimized trained function,
wherein the trained function is an optimized trained function.

19. A system control unit for a magnetic resonance apparatus, the system control unit comprising:
a processor configured to:
provide magnetic field data using a trained function, the provision of the magnetic field data using the trained function comprising:
receipt of image data as input data of the trained function;
application of the trained function to the image data, wherein the trained function is trained based on:
a data fidelity of image data corrected based on magnetic field data; and
at least one assumption about at least one attribute of the magnetic field data; and
provision of the magnetic field data as output data of the optimized trained function,
wherein the trained function is an optimized trained function.

20. In a non-transitory computer-readable storage medium that stores instructions executable by a programmable system control unit of a magnetic resonance apparatus to produce an optimized trained function, for providing magnetic field data, the instructions comprising:
   providing training image data;
   providing corrected training image data produced based on the training image data;
   providing a provisional trained function;
   producing provisional magnetic field data, the producing of the provisional magnetic field data comprising applying the training image data to the provisional trained function;
   producing provisional corrected image data based on the provisional magnetic field data and the training image data;
   determining data fidelity information based on the provisional corrected image data and the corrected training image data;
   determining at least one item of assumption fidelity information based on the provisional magnetic field data and an assumption about an attribute of the provisional magnetic field data;
   determining optimization information based on the data fidelity information and the at least one item of assumption fidelity information; and
   producing the optimized trained function, the producing of the optimized trained function comprising optimizing the provisional trained function based on the optimization information.

* * * * *